United States Patent [19]

Buelow et al.

[11] 4,180,772

[45] Dec. 25, 1979

[54] LARGE-SCALE INTEGRATED CIRCUIT WITH INTEGRAL BI-DIRECTIONAL TEST CIRCUIT

[75] Inventors: Fred K. Buelow, Los Altos Hills; John J. Zasio, Sunnyvale, both of Calif.

[73] Assignee: Fujitsu Limited, Kawasaki, Japan

[21] Appl. No.: 801,906

[22] Filed: May 31, 1977

[51] Int. Cl.² .................................................. G01R 15/12
[52] U.S. Cl. ................................................... 324/73 PC
[58] Field of Search ............ 324/73 R, 73 AT, 73 PC

[56] References Cited

U.S. PATENT DOCUMENTS 3,781,683  12/1973  Freed ................................ 324/73 R

OTHER PUBLICATIONS

Savkar, A. D.; N. Way Testpoint for Complex LSI Design; IBM Tech. Bull.; vol. 14; No. 10; Mar. 1972; pp. 2937-2938.
Barnard et al., Shift Register Tester on a Chip; IBM Tech. Bull.; vol. 15, No. 9, Feb. 1973; pp. 2935-2936.
Muehldorf, E. I.; Printed Circuit Card Incorporating Circuit Test Register; IBM Tech. Bull.; vol. 16; No. 6; Nov. 1973; p. 1732.
Jadus et al., Test Pad Multiplexing; IBM Tech. Bull.; vol. 18; No. 7, Dec. 1975; pp. 2181-2182.

Primary Examiner—Robert J. Corcoran
Attorney, Agent, or Firm—David E. Lovejoy

[57] ABSTRACT

A large scale integrated circuit with external integral access test circuitry having a semiconductor body with a surface. A large scale integrated circuit is formed in the semiconductor body through the surface and comprises a large number of interconnected circuit elements with a large number of input and output pads connected to the circuit elements and disposed near the outer perimeter of the semiconductor body. An integrated test circuit is formed in the semiconductor body and extends through the surface. The integrated test circuit has a plurality of probe pads carried by the semiconductor body and connected to the test circuit. The integrated test circuit is formed external of but in relatively close proximity to the large scale integrated circuit. Leads are provided on the semiconductor body which connect the integrated test circuit to the large scale integrated circuit whereby access can be obtained to the large scale integrated circuit through probing of the probe pads of the integrated test circuit to ascertain the characteristics of the large scale integrated circuit.

10 Claims, 7 Drawing Figures

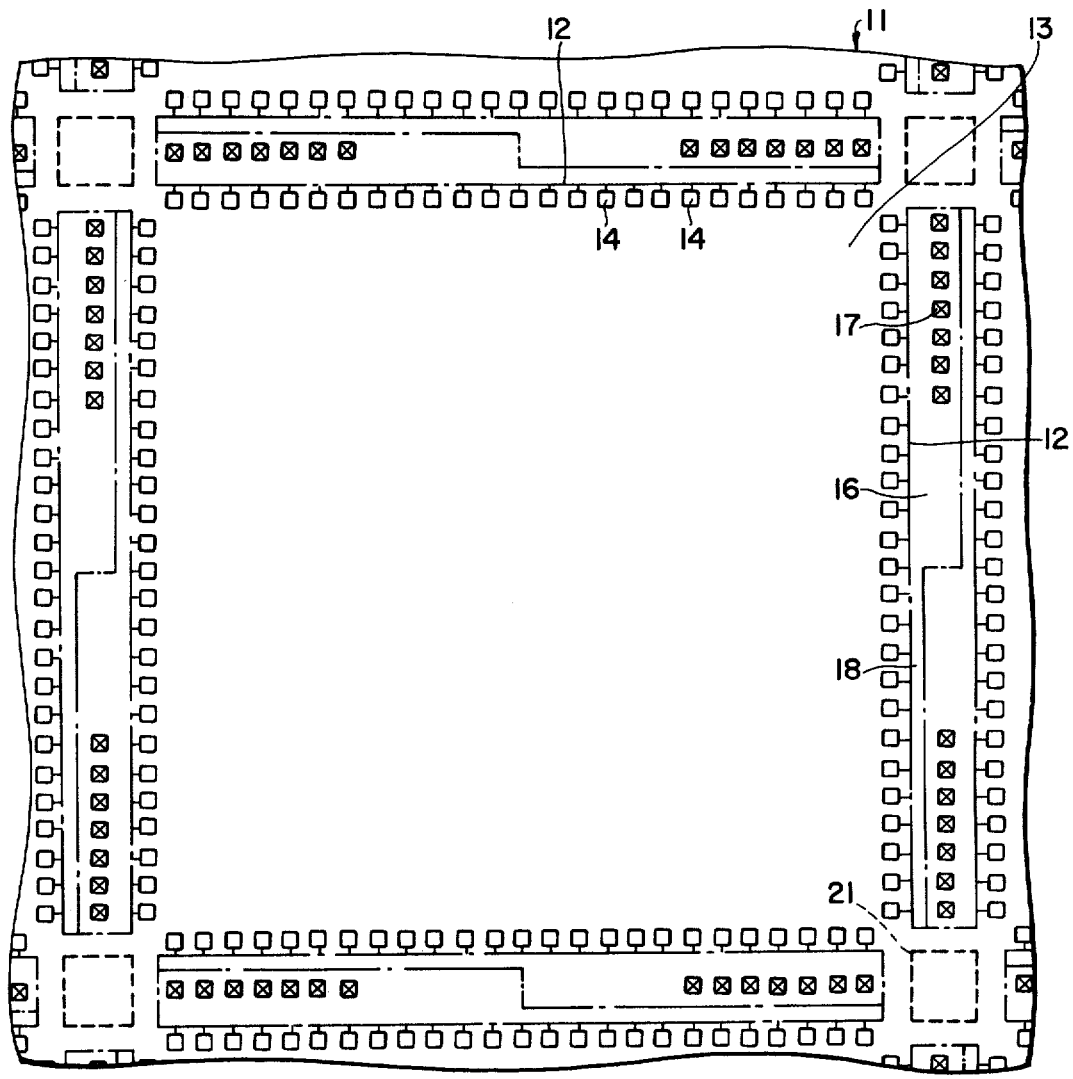
FIG_1
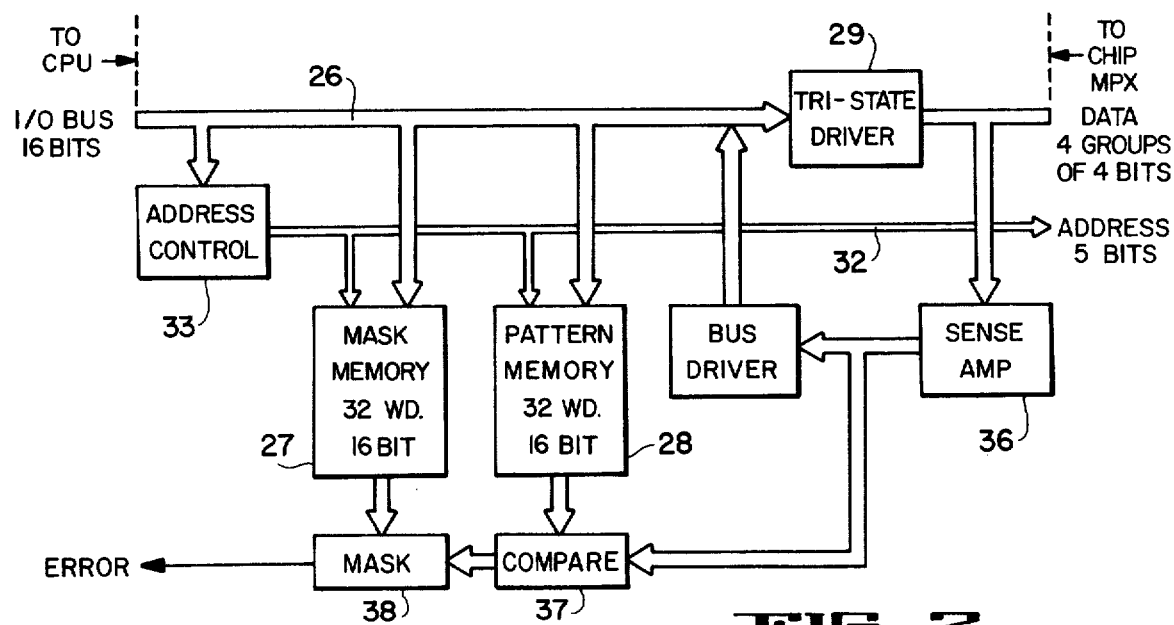
FIG_2

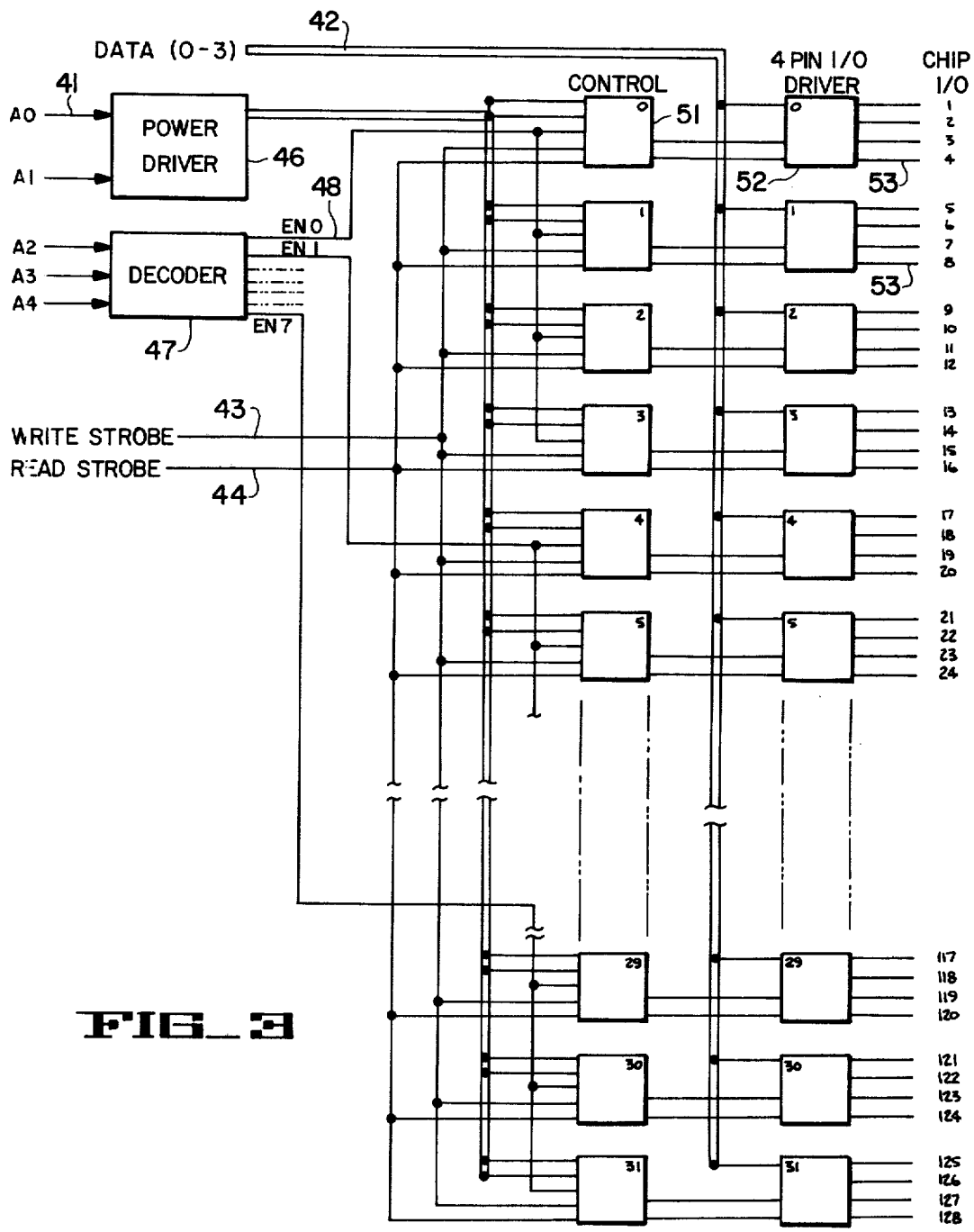
FIG_3
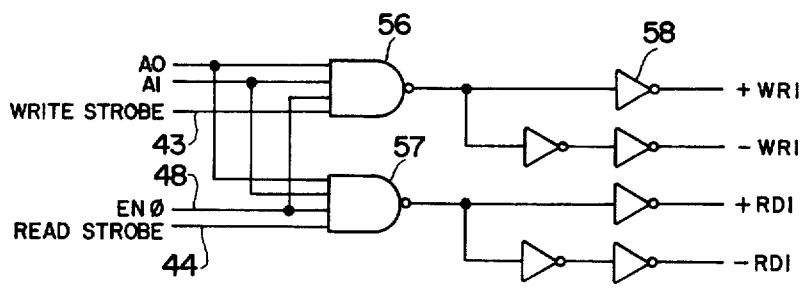
FIG_4

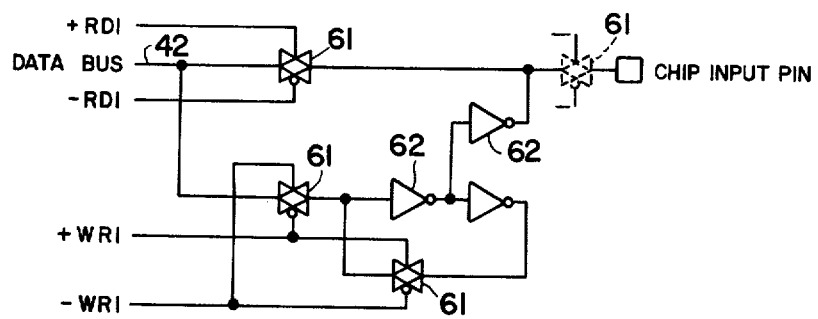
FIG_5
FIG_6
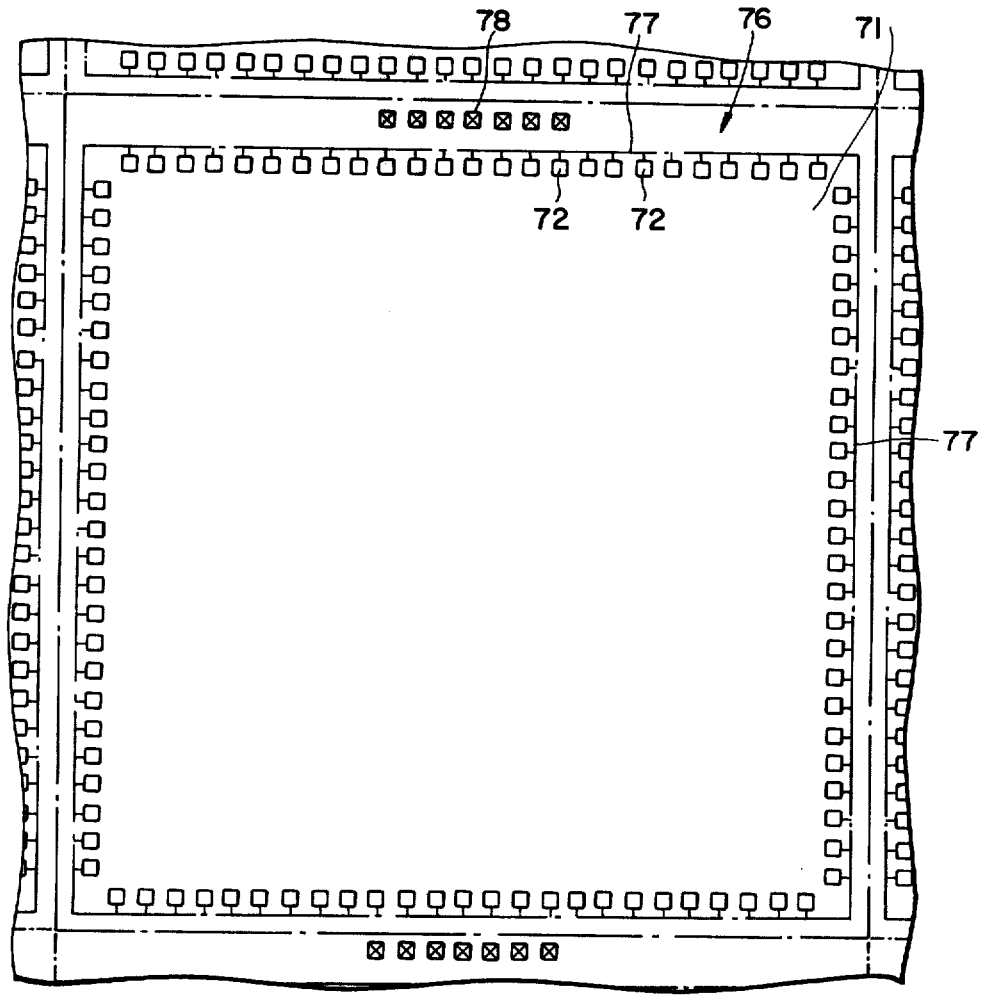
FIG_7

LARGE-SCALE INTEGRATED CIRCUIT WITH INTEGRAL BI-DIRECTIONAL TEST CIRCUIT

BACKGROUND OF THE INVENTION

It has been found that as large scale integrated circuits have become more complex and complicated and also have become larger in scale, there is a requirement for a greater number of input and output pads for the large scale integrated circuit. It has been found that the larger the number of output and input pads the greater the difficulty in making simultaneous contact to all of the pads during probing of the same to test the large scale integrated circuit. As the number of pads increase, the probing difficulties increase and the greater the chances that the yield will be affected by difficulties in making simultaneous contact to all of the input and output pads of the large scale integrated circuit. There is therefore a need for a new and improved large scale integrated circuit which makes probing of the same for testing less difficult and without having any yield reduction due to the difficulties in making simultaneous probe contact to the pads of the large scale integrated circuit.

SUMMARY OF THE INVENTION AND OBJECTS

The large scale integrated circuit consists of a semiconductor body having a surface. A large scale integrated circuit is formed on the semiconductor body and extends through the surface and is comprised of a large number of interconnected circuit elements and a large number of input and output pads connected to the circuit elements and disposed near the outer perimeter of the semiconductor body. An integrated test circuit is formed in the semiconductor body and extends through said surface. The integrated test circuit has a plurality of probe pads carried by the semiconductor body and connected to the test circuit. The integrated test circuit is formed external of but in relatively close proximity to the large scale integrated circuit. Leads are provided on the semiconductor body connecting the integrated test circuit to the large scale integrated circuit whereby access can be obtained to the large scale integrated circuit through probing of said probe pads of the integrated test circuit to ascertain the characteristics of the large scale integrated circuit.

In general, it is an object of the present invention to provide a large scale integrated circuit and method which makes it possible to greatly reduce the total number of probes which are required to test the large scale integrated circuit.

Another object of the invention is to provide a circuit and method of the above character which is capable of being used with a large scale integrated circuit having at least several hundred input and output pads.

Another object of the invention is to provide a circuit and method of the above character in which a separate integrated test circuit is formed on the semiconductor body integral with the semiconductor body and connected to the test circuit to facilitate obtaining access to the test circuit through probe pads carried by the integrated test circuit.

Another object of the invention is to provide a circuit and method of the above character in which larger probe pads can be provided and in which there is no danger of damaging the input and output pads of the large scale integrated circuit.

Another object of the invention is to provide a circuit and method of the above character in which the integrated test circuit is removed and is thrown away after the testing of the large scale integrated circuit has been accomplished.

Another object of the invention is to provide a circuit and method of the above character in which the integrated test circuit can be customized to the testing of the large scale integrated circuit.

Another object of the invention is to provide a circuit and method of the above character in which the integrated test circuit although customized for the large scale integrated circuit, can itself be tailored to a universal interface with a probing apparatus.

Another object of the invention is to provide a circuit and method of the above character in which the leads interconnecting the integrated test circuit to the large scale integrated circuit can be bi-directional lines.

Another object of the invention is to provide a circuit and method of the above character in which the circuit is rectangular having four sides with input and output pads on each of the sides.

Another object of the invention is to provide a circuit and method of the above character in which the integrated test circuit is formed integral with at least one of the sides.

Another object of the invention is to provide a circuit and method of the above character in which an integrated test circuit is formed on each of the sides.

Another object of the invention is to provide a circuit and method of the above character in which the integrated test circuit for each large scale integrated circuit is formed in such a manner that the integrated test circuits for adjacent large scale integrated circuits are complimentary in so far as the space requirements are concerned.

Additional objects and features of the invention will appear from the following description in which the preferred embodiments are set forth in detail in conjunction with the accompanying drawings.

BRIEF DESCRIPTION OF THE DRAWINGS

FIg. 1 is a plan view of a portion of a semiconductor wafer showing a plurality of large scale integrated circuits with external and integral access test circuitry incorporating the present invention.

FIG. 2 is a logic and block diagram showing the interface which is utilized between a computer and the multiplexer in the integrated test circuit provided for the large scale integrated circuit.

FIG. 3 is a block diagram of a portion of the multiplexer which is utilized as the access test circuitry for the large scale integrated circuit.

FIG. 4 is a schematic diagram showing what is included in one of the control blocks shown in FIG. 3.

FIG. 5 is a detailed block diagram showing what is incorporated in an input-output driver circuit for an input pin or pad.

FIG. 6 is a detailed block diagram of what would be provided in a driver block shown in FIG. 3 for an output pin or pad.

FIG. 7 is a plan view of another large scale integrated circuit incorporating the present invention with the external integral access test circuitry being provided on only one side of the large scale integrated circuit.

DESCRIPTION OF THE PREFERRED EMBODIMENTS

In FIG. 1, there is shown a large scale integrated circuit with an external integral access test circuit incorporating the present invention. As shown, the large scale integrated circuit consists of a semiconductor body 11 formed of a suitable material such as silicon. The semiconductor body can be of any desired size as for example can comprise an entire wafer having a diameter of 3 or 4 inches. A large scale integrated circuit can be formed in the semiconductor body by conventional techniques or by the use of techniques disclosed in the co-pending application Ser. No. 801,907, filed May 31, 1977, now abandoned in favor of application Ser. No. 847,478, filed Nov. 1, 1977 to provide a large scale integrated circuit comprised of a large number of integrated circuit elements. As is well known to those skilled in the art, the integrated circuits can be formed utilizing any desired logic family or technology. For example, it can be formed of a $T^2L$, CMOS and the like as hereinafter described in more detail.

The circuit elements comprise conventional semiconductor circuit elements such as transistors, diodes, resistors and even the capacitors. As is well known to those skilled in the art, these circuit elements can be interconnected in a conventional manner as by way of example, by the use of two or more layers of metalization with vias extending between the layers of metalization. The large scale integrated circuit can have any desired geometry as for example, a rectangular geometry in the form of a square having four sides 12 of equal length. The large scale integrated circuit 13 is formed within the confines of the sides 12 with a large number of pads 14 provided on the semiconductor body adjacent each of the sides 12. Although only twenty-five pads 14 are shown in the drawing on each of the sides 12 adjacent the outer perimeter of the semiconductor body 11 carrying the large scale integrated circuit, it should be appreciated that it is contemplated with the present invention that at least one-hundred such pads 14 would be provided on each of the sides to provide a total of at least four-hundred input and output pads.

Integrated test circuitry 16 is provided for the large scale integrated circuit 13 which is formed integral with the semiconductor body external of but in relatively close proximity to the large scale integrated circuit. As hereinafter described, the integrated circuit 16 is in the form of a multiplexer. The integrated test circuit 16 is provided on at least one side of the large scale integrated circuit 13. In FIG. 1, it can be seen that an integrated test circuit 16 is provided on each of the four sides 12 of the large scale integrated circuit 13. Each of the integrated test circuits 16 is comprised of a plurality of interconnected circuit elements which are formed in the semiconductor body and extend through the surface of the semiconductor body. The integrated circuit elements can be interconnected by the two layer metalization system hereinbefore described for use with the large scale integrated circuit. Leads (not shown) are provided for interconnecting the integrated test circuit and the LSI circuit 13. The interconnecting leads between the test multiplexer or integrated test circuit 16 and the LSI circuit can be made by the use of single leads going to each of the pads 14 by the use of first level metalization. The integrated test circuit is provided with a plurality of probe pads 17 which are formed within the boundaries of the integrated test circuit. By way of example as shown in FIG. 1, each of the integrated test circuits is provided with seven probe pads which are indicated by crosses in the pads whereas the pads provided for the large scale integrated circuit are provided with a blank interior. It will be noted that the space required for each of the integrated circuits 16 provided on each side 12 is substantially L-shaped as shown. The L-shape makes it possible to place the probe pads in the larger portion of the L-shaped space or area while still making it possible to provide leads from the integrated test circuit which extend to all of the pads 14 of the large scale integrated circuit. It also will be noted in FIG. 1 that the L-shaped areas 18 for adjacent large scale integrated circuits are complimentary to each other. Thus, it can be seen that the L-shaped configuration for the integrated test circuits make it possible to economize the amount of space taken by the integrated test circuits while still making it possible to provide relatively large probe pads 17 for the integrated test circuits. The broken rectangle 21 provided on the corners of the large scale integrated circuit between the integrated test circuits represent scribe lines for cutting the large scale integrated circuits from the wafer and also for separating the integrated test circuits from the large scale integrated circuit. The scribe lines also indicate in the manner hereinafter described that the integrated test circuits are separated from the large scale integrated circuit and can be thrown away after they have been utilized to ascertain whether or not the large scale integrated circuit meets predetermined requirements.

It will be noted that the integrated test circuits are formed external of the large scale integrated circuit but are in relatively close promimity thereto to facilitate interconnection of the same with the pads of the large scale integrated circuit.

It can be seen from the illustration shown in FIG. 1 that the large scale integrated circuits butt up very close to each other even though some space is required for the integrated test circuits which are provided on each side of each of the large scale integrated circuits.

In FIG. 2 there is shown a block diagram and logic interconnections for the interface circuitry for a computer to be utilized in the testing operation with the integrated test circuits 16. As hereinbefore explained the integrated test circuits are in the form of multiplexers provided on each side of the large scale integrated circuit 13 for testing the integrated circuit 13. As shown in FIG. 2 it can be seen that the circuitry therein is substantially conventional. The Input-Output bus 26 is connected to a CPU. The CPU can be any 16-bit computer with a direct memory access channel as for example a Hewlitt-Packard HP21MX a Data General NOVA or a DEC PDP 11.

The bus 26 feeds into a conventional $T^2L$ circuitry. This circuitry includes a mask memory 27 and a pattern memory 28. The pattern memory contains a 1 or 0 for each pad on the large scale integrated circuit whereas the mask memory contains a 1 or a 0 depending on whether the pad on the large scale integrated circuit was to be tested or ignored. It is essentially a mask memory to ignore unknown values. 16-bit information is supplied from the computer to the pattern memory and also to a tri-state driver 29 through a bus 26 which is connected through probes or a probing apparatus (not shown) which makes contacts to the probe pads 17 of each of the multiplexers 16 for the large scale integrated circuit. As is well known to those skilled in the art, the tri-state driver 29 has a capability of forcing the line to which it is connected to either a 1 or a 0 or to disconnect itself from the circuit to allow another function to take place.

In operation, the tri-state driver 29 supplies signals to latches provided in the multiplexer. Address bits are supplied from a bus 32 from an address control 33 also connected to the input-output bus 26. The five address bits being supplied by the bus 32 determine which latches have data loaded into the same. After the data has been loaded into the large scale integrated circuit, the tri-state driver 29 is turned off and the address bits from the address control, 33 are cycled through a second time and then data is read through the multiplexer from every pad 14 of the large scale integrated circuit and supplied through a sense amplifier 36 where it is compared in a block 37 with the expected values that are stored in the pattern memory 28. 16-bits are compared at a time. The mask 38 in association with the mask memory 27 ensures that the comparison will take place only between the desired parameters. The mask 38 masks out unknown values so that they cannot be considered as errors. When an error is ascertained, the test is re-run up to the point where an error is found and then additional measurements are made through the bus driver from the sense amplifier 36 to determine which pads supplied the erroneous information.

It is believed with the interface shown in FIG. 2 that it should be capable of running a testing operation under 100 microseconds per test.

In FIG. 3 there is shown a detailed block diagram of what is found in one of the integrated test circuits 16 on one side of the LSI 13. Thus, the circuitry shown in FIG. 3 represents ¼ of the total multiplexer circuitry provided for the LSI 13. As shown in FIG. 3 it is provided with five address lines 41 identifies A0, A1, A2, A3 and A4 and four data lines 0 through 3. It is also provided a write strobe line 43 which serves to load data into the latches provided in the multiplexer circuit shown in FIG. 3. A read strobe line 44 is provided which takes data from every I/O and reads it back onto the data lines. In addition, there is a chip clock (not shown) which may be used occasionally and which is provided with power and ground connections which make it necessary to provide a total of fourteen pins for connection to the integrated test circuit 16 provided on each of the four sides of the LSI 13.

The two address lines A0 and A1 are connected to a power driver 46 and the address lines A2, A3, and A4 are connected to the decoder 47 which is provided with eight enable lines 48 identified as EN0 through EN7. The power driver 46 and the decoder 47 are connected to control blocks 51 shown which are numbered 0 through 31. The control blocks are connected to four pin I-O drivers 52 also numbered 0 through 31. The drivers 52 are provided with four pins for the 32 drivers 52. The 3-bit address decoder 47 and the power driver 46 are essentially used to give a selection of which of the four data lines 42 are going to drive the drivers 52. Thus, it can be seen that each driver 52 will drive four I/O pins 53 from the data bus 42 and thus, will either drive with information received on the data bus or receive information and supply it to the data bus. The address and control circuitry is utilized to decode the address and to determine which driver of the drivers 52 is to be connected to the data bus. 4-bits at a time are supplied to each of the four integrated test circuits of the multiplexers 16 which requires a 16-bit word be supplied from the pattern memory 28. The 16-bit word is broken up into four groups of 4-bits with 4-bits being supplied to each side of the LSI 13.

The blaock diagram shown in FIG. 3 is in fact a two stage decoder in which the 3-bit decoder 47 serves as a first stage to the eight enable lines 48 and the second stage consists of the control boxes 51 which control the write and read strobes 43 and 44 into the IO drivers 52 to insure that only one group of write strobes or read strobes can be turned on at any instant in time. In normal operation one would cycle through the five address lines going from the binary value of 0 through a binary value of 1 which in turn would connect the four pin IO drivers one at a time to the data bus and allow the data to be either loaded into that IO driver or data to be taken from the pins 53 of the IO driver and supplied to the data bus line 42. Thus it can be seen that the block diagram shown in FIG. 3 is essentially a multiplexing for the four data lines 42 to one-hundred and twenty-eight pins on each side of the LSI chip carrying a total of five-hundred and twelve pins for the four sides of the LSI chip.

In FIG. 4, there is shown a more detailed block diagram of what is provided in one of the control boxes at 51 shown in FIG. 3. As shown in FIG. 3, each control block 51 is connected to the write strobe line 43 and the read strobe line 44, to address lines from the power driver 46 and enable line 48 from the decoder 47. The control 51 allows only one driver 52 to be turned on at one time that is one out of 32. For this purpose a pair of NAND gates 56 and 57 are provided which are connected to Inverters 58 to the four Lines which are identified as +WR1, −WR1, +RD1 and −RD1 respectively.

It is apparent that a two stage decoder is advantageous in that it makes it possible to utilize fewer components rather than making a 5 to 32 decoder in one level.

In FIGS. 5 and 6 there are shown detailed block diagrams of the circuitry which would be provided in the drivers 52. For each IO pin provided on the LSI chip one or the other of the configuration shown in FIGS. 5 or 6 would be utilized. FIG. 5 shows circuitry for a chip input pin whereas FIG. 6 shows circuitry for a chip output pin. Latches are provided on each input pin hold a data value to be driven into the chip.

As shown in FIG. 5, the circuitry for each input pin includes a plurality of transmission gates 61 of the type which are found in CMOS. A plurality of inverters 62 are also provided. The use of the transmission gates is desirable because it makes it possible to measure analog values such as voltage. It should be appreciated that if the multiplexer or integrated test circuit was built with some other technology such as T$^2$L or emitter coupled logic, this transmission gate 61 would not be available and in such a case, a conventional logic circuitry would be utilized to make it possible to only supply logical 1 and 0 values to the input pin.

It can be seen from FIG. 6 that the output pin circuitry only requires a single transmission gate. Thus, the logic required for an output pin is much less than that required for an input pin. This makes it possible to customize the multiplexer to the LSI 13. Thus, if a pin is only to be used as an output pin, the lesser circuitry shown in FIG. 6 can be provided. If it is only necessary to use it as an input pin, only the circuitry shown in FIG. 6 is required.

From the foregoing it can be seen that the integrated test circuit 16 which is provided on each side of the LSI chip and is in fact a multiplexer which makes it possible for a probe to make contact to the LSI chip through a relatively small number of probe pads 17 carried by the integrated test circuit 16. After the testing has been completed and the LSI circuit has been found to be capable of meeting the desired circuit parameters, the integrated test circuits 16 can be removed from the LSI chip 13 by scribing along the scribe lines 21 so that all four of the integrated test circuits or multiplexer circuits 16 provided on the four sides are separated from the LSI chip. After this has been completed, the LSI chip can be mounted in a package in a conventional manner and leads such as gold wires bonded to the pads 14 and to the leads of the package to provide connections from the LSI chip to the outside world.

Thus, it can be seen that there has been provided a means making it much easier to check an LSI chip with relatively little danger of cutting the yield of the LSI chips because of poor contact to a multitude of probe pads since in the present case the total number of probe pads has been limited.

It should be appreciated that if desired, the multiplexer chip or integrated test circuit 16 provided on each side may be left intact with the LSI chip. It may be desirable to do this in the event it is necessary to test the LSI chip in the field. For reasons that the integrated test circuit or multiplexer 16 facilitates testing upon manufacture, it also facilitates testing in the field because of the greatly reduced number of probe contacts which are required.

When the multiplexer or integrated test circuit 16 is left intact with the LSI chip, the multiplexer or integrated test circuit 16 can be separated electrically from the LSI chip by use of a transmission gate provided in each of the IO pins which would disconnect the integrated test circuit or multiplexer 16 when it is not in use. The only disadvantage is that even though the multiplexers are disconnected, a small amount of stray capacity would be added on each of the IO pins. Thus, as shown in FIG. 5 there would be provided an additional transmission gate which is shown in broken lines in FIG. 5 together with a single lead for controlling that transmission gate which can be common to all of the transmission gates. For example, during testing, the transmission gate would be turned on and would be left on.

In FIG. 7 there is shown another embodiment of the invention in which a single multiplexer has been provided for the entire LSI chip rather than four separate multiplexers on the four sides of the LSI chip. The LSI chip 71 shown in FIG. 7 which may be substantially identical to the LSI chip 13 as shown in FIG. 1 is provided with a plurality of output pads 72. A single large multiplexer 76 is provided on one of the four sides 77 of the LSI chip 71. The integrated test circuit or the multiplexer 76 is provided with probe pads 78 which are adapted to be engaged by a probe connected to a computer as in connection with the foregoing embodiment. The multiplexer circuit 76 is connected to the individual pads 72 of the LSI circuit 71 by leads in the first level layer of metalization.

The principal disadvantage of utilizing a single multiplexer as shown in FIG. 7 over a plurality of multiplexers as in FIG. 1 is that longer leads are required for connecting the multiplexer circuit 76 to all of the pads 72 provided on the LSI chip rather than merely connecting the LSI pads on one side to the multiplexer. The number of probe pads required for connection to the outside world would be substantially reduced. For example, from the 56 probe pads required where there are four multiplexers used as shown in FIG. 1, the amount of probe pads could be reduced by approximately ¼ by utilizing the single multiplexer. It can be seen that by utilizing the multiplexer on one side, and by utilizing two additional pins it is possible to select one side at a time. Thus, it can be seen that it is possible to greatly reduce the number of probe pads with the only disadvantage being that essentially longer wiring is required to make contact to all of the pads of the LSI chip.

As pointed out with respect to the previous embodiments, the integrated test circuit or multiplexer 76 can be severed from the LSI chip after testing of the LSI chip. Alternatively by the use of transmission gates it can remain with the LSI chip so that the LSI chip can be tested in the field.

It is apparent from the foregoing that there has been provided a large scale integrated circuit with external integral access test circuitry and a method for testing the same which makes it possible to greatly reduce the number of probe contacts required and therefore eliminate yield drops due to poor or no contacts to certain pads.

We claim:

1. In a large scale integrated circuit, a semiconductor body having a surface, said large scale integrated circuit formed in said semiconductor body through said surface and comprising a large number of interconnected circuit elements and a large number of input and output pads connected to the circuit elements and disposed near the outer perimeter of the semiconductor body, at least one integrated test circuit having interconnected circuit elements formed in the semiconductor body and extending through said surface, said integrated test circuit having a plurality of probe pads carried by the semiconductor body and connected to the test circuit, said integrated test circuit being formed external of but in relatively close proximity to said large scale integrated circuit, said integrated test circuit including bi-directional driver means directionally selectable for writing data into or for reading data from said large scale integrated circuit, said bi-directional driver means including write means responsive to write signals for selecting said bi-directional driver means in a direction to write data into said large scale integrated circuit and including read means responsive to read signals for selecting said bi-directional drive means in a direction to read data from said large scale integrated circuit, said bi-directional driver means connected between one of said probe pads and a plurality of said input and output pads whereby access can be obtained to said large scale integrated circuit through probing of said probe pads.

2. An integrated circuit as in claim 1 wherein said large scale integrated circuit and said integrated test circuit are positioned whereby the integrated test circuit can be separated from the large scale integrated circuit after the large scale integrated circuit has been tested.

3. An integrated circuit as in claim 1 wherein said integrated test circuit includes transmission gates connecting the integrated test circuit to the large scale integrated circuit and means for opening the transmission gates when the integrated test circuit is not being utilized.

4. An integrated circuit as in claim 1 wherein said integrated test circuit includes a multiplexer, said multiplexer including address means for addressing with address signals an addressed one of said plurality of said input and output pads to establish electrical conduction between said one of said probe pads and said addressed one of said plurality of said input and output pads.

5. An integrated circuit as in claim 1 wherein said semiconductor body is provided with four sides and wherein said integrated test circuit is provided adjacent to at least one of the four sides.

6. An integrated circuit as in claim 5 including four integrated test circuits, each integrated test circuit provided adjacent to one of the four sides.

7. An integrated circuit as in claim 1 wherein a plurality of large scale integrated circuits are provided on the semiconductor body and wherein each of the large scale integrated circuits is provided with four sides and an ingegrated test circuit provided on each side and in which the integrated test circuits of adjacent sides of large scale integrated circuits are formed in complimentary positions.

8. An integrated circuit as in claim 4 wherein said integrated test circuit includes a two-stage decoder responsive to said read and write signals and responsive to said address signals for decoding both the selection of said addressed one of said plurality of said input and output pads and the selection of the read or write direction of said bi-directional driver means.

9. An integrated circuit as defind by claim 1 wherein said bi-directional driver means includes latch means for holding data transferred between said integrated test circuit and said large scale integrated circuit.

10. In a large-scale integrated circuit formed by circuit elements interconnected in a semiconductor body with input and output pads connected to the circuit elements, a plurality of integrated test circuits integrally formed in the semiconductor body, each of said integrated test circuits comprising, a probe pad carried by the semiconductor body and electrically connected to the integrated test circuit, control means for generating address signals for addressing said input and output pads and for generating write signals and read signals for controlling the direction of conduction between said probe pad and said input and output pads, bi-directional driver means directionally selectable for writing data into or for reading data from said large-scale integrated circuit, said bi-directional driver means including first write means responsive to decoder write signals for selecting said bi-directional driver means in a direction to write data into said large-scale integrated circuit and including read means responsive to decoder read signals for selecting said bi-directional driver means in a direction to read data from said large-scale integrated circuit, said bi-directional drive means connected between said probe pad and a plurality of said input and output pads, a two-stage decoder responsive to said read and write signals and responsive to said address signals for generating said decoder write signals and said decoder read signals to establish electrical conduction between said probe pad and an addressed one of said plurality of said input and output pads in a read or write direction determined by said control means whereby bi-directional access for reading or writing of data from said probe pad to addressed ones of said plurality of said input and output pads is obtained.

* * * * *